(12) United States Patent
Gangakhedkar (10) Patent No.: US 11,180,846 B2
(45) Date of Patent: Nov. 23, 2021

(54) FINE LEVELING OF LARGE CAROUSEL BASED SUSCEPTOR

(71) Applicant: Applied Materials, Inc., Santa Clara, CA (US)

(72) Inventor: Kaushal Gangakhedkar, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 169 days.

(21) Appl. No.: 16/708,308

(22) Filed: Dec. 9, 2019

(65) Prior Publication Data

US 2020/0115792 A1  Apr. 16, 2020

Related U.S. Application Data

(62) Division of application No. 15/657,721, filed on Jul. 24, 2017, now Pat. No. 10,501,844.

(60) Provisional application No. 62/366,337, filed on Jul. 25, 2016.

(51) Int. Cl.
```
H01L 21/687   (2006.01)
C23C 14/50    (2006.01)
C23C 16/458   (2006.01)
C23C 16/455   (2006.01)
```
(52) U.S. Cl.
CPC ........ *C23C 14/505* (2013.01); *C23C 16/4584* (2013.01); *C23C 16/45551* (2013.01); *H01L 21/68764* (2013.01); *H01L 21/68771* (2013.01); *H01L 21/68785* (2013.01)

(58) Field of Classification Search
CPC ......... H01L 21/68785; H01L 21/67126; H01L 21/68792
See application file for complete search history.

(56) References Cited

U.S. PATENT DOCUMENTS

| | | | | | |
|---|---|---|---|---|---|
| 3,192,844 | A | * | 7/1965 | Szasz | H01L 21/682 355/78 |
| 5,051,054 | A | * | 9/1991 | Wagner | C23C 16/466 414/618 |
| 5,065,495 | A | * | 11/1991 | Narushima | B25B 11/005 29/559 |
| 5,249,343 | A | * | 10/1993 | Grosso | B23Q 16/04 269/21 |
| 5,804,042 | A | * | 9/1998 | Ferreira | C23C 14/50 118/728 |

(Continued)

FOREIGN PATENT DOCUMENTS

WO  2009094275 A2  7/2009

OTHER PUBLICATIONS

PCT International Search Report and Written Opinion in PCT/US2017/043654 dated Nov. 8, 2017, 18 pages.

(Continued)

*Primary Examiner* — Tyrone V Hall, Jr.
(74) *Attorney, Agent, or Firm* — Servilla Whitney LLC (57) ABSTRACT

Pedestal assemblies with a thermal barrier plate, a torque plate and at least one kinematic mount to change a plane formed by the thermal barrier plate are described. Susceptor assemblies and processing chambers incorporating the pedestal assemblies are also described. Methods of leveling a susceptor to form parallel planes between the susceptor surface and a gas distribution assembly surface are also described.

16 Claims, 7 Drawing Sheets

(56) References Cited

U.S. PATENT DOCUMENTS

| | | | | |
|---|---|---|---|---|
| 5,860,640 A | * | 1/1999 | Marohl | H01L 21/68742 |
| | | | | 269/289 R |
| 6,394,440 B1 | * | 5/2002 | Carrell | H01L 21/67126 |
| | | | | 118/729 |
| 2004/0177813 A1 | | 9/2004 | Schieve et al. | |
| 2005/0011768 A1 | * | 1/2005 | Stone | H01L 21/68785 |
| | | | | 205/318 |
| 2008/0017117 A1 | * | 1/2008 | Campbell | H01L 21/68792 |
| | | | | 118/729 |
| 2009/0272719 A1 | * | 11/2009 | Collins | H01L 21/67259 |
| | | | | 216/58 |
| 2013/0152859 A1 | | 6/2013 | Collins et al. | |

OTHER PUBLICATIONS

PCT International Preliminary Report on Patentability in PCT/US2017/043654 dated Feb. 7, 2019, 14 pages.

\* cited by examiner

FINE LEVELING OF LARGE CAROUSEL BASED SUSCEPTOR

CROSS-REFERENCE TO RELATED APPLICATIONS

This application is a divisional of U.S. patent application Ser. No. 15/657,721, filed Jul. 24, 2017, now U.S. Pat. No. 10,501,844, issued Dec. 10, 2019, which claims priority to U.S. Provisional Application No. 62/366,337, filed Jul. 25, 2016, the entire disclosures of which are hereby incorporated by reference herein.

TECHNICAL FIELD

The present disclosure relates generally to leveling rotational components. In particular, embodiments of the disclosure are directed to apparatus and methods to level a susceptor in a batch processing chamber.

BACKGROUND

In carousel based ALD applications, a small gap (e.g., a few mm) between the susceptor and injector is used for deposition uniformity. Minimum flatness and parallelism of both the susceptor and injector are important for processing uniform ALD films. Flatness of a large silicon carbide coated graphite susceptor during manufacturing is difficult to control because of gravity and warpage from purification and at least two high temperature silicon carbide coatings. Additionally, the properties of a graphite plate vary with the direction of slicing of a graphite billet.

Flatness of the susceptor can affect in-wafer uniformity of film thickness and resistivity. However, poor parallelism of susceptor wafer plane to pedestal plane gives rise to axial runout and wafer-in-batch non-uniformity. Flatness and parallelism can be minimized by controlling graphite substrate machining and fixturing during high temperature silicon carbide coatings. However, the yield and control is low because of the use of a high temperature process and can be difficulty to control.

Currently, current susceptor-motor assembly hardware runout specifications are hard to meet with low yield of usable susceptor-motor assembly hardware. Axial runout results from poor parallelism of pockets plane to bottom pedestal plane. Current carousel batch processing chambers may use gap camera to measure the outer diameter runout. When the susceptor axial runout is high, the wafers are not equidistant to the injector plane in the vertical direction and causes wafer to injector distances to vary during processing.

Therefore, there is a need in the art for apparatus and methods to provide increased parallelism of the susceptor to injector planes and/or minimizing runout of the susceptor.

SUMMARY

One or more embodiments of the disclosure are directed to pedestal assemblies comprising a thermal barrier plate, a torque plate and at least one kinematic mount assembly. The thermal barrier plate has a top surface and a bottom surface defining a thickness. A center opening extends through the thickness of the thermal barrier plate at a center of the thermal barrier plate. At least one torque opening extends through at least the bottom surface of the thermal barrier plate, and at least one leveling hole extends through the thickness of the thermal barrier plate. The at least one leveling hole is located at a distance from the center opening. The torque plate is below the thermal barrier plate and has a top surface and a bottom surface defining a thickness. A center opening extends through the thickness of the torque plate. At least one torque rod extends from the top surface of the torque plate and is aligned with the at least one torque opening in the thermal barrier plate. The kinematic mount assembly is positioned within at least one leveling hole in the thermal barrier plate and comprises a mounting stud having an inner surface, an outer surface and a length defined by a top surface and a bottom surface. The mounting stud is sized to fit within the leveling hole. The kinematic mount assembly includes a lockdown screw positioned to contact the inner surface of the mounting stud and move along the length of the mounting stud.

Additional embodiments of the disclosure are directed to susceptor assemblies comprising a susceptor, a thermal barrier plate, a torque plate and at least one kinematic mount assembly. The susceptor has a top surface and a bottom surface defining a thickness with a plurality of recesses formed in the top surface sized to support a substrate for processing. A center opening extends from the bottom surface of the susceptor at least partially through the thickness. At least one susceptor torque opening extends from the bottom surface of the susceptor and at least three susceptor leveling holes extend through the thickness of the susceptor. The thermal barrier plate has a top surface and a bottom surface defining a thickness. The top surface of the thermal barrier plate is positioned adjacent to the bottom surface of the susceptor. A center opening extends through the thickness of the thermal barrier plate at a center of the thermal barrier plate. At least one torque opening extends through the thickness of the thermal barrier plate and is aligned with the at least one susceptor torque opening. At least three leveling holes extend through the thickness of the thermal barrier plate; each leveling hole aligned with a leveling hole in the susceptor. The torque plate is below the thermal barrier plate and has a top surface and a bottom surface defining a thickness. A center opening extends through the thickness of the torque plate and is aligned with the center opening in the thermal barrier plate. At least one torque rod extends from the torque plate through the at least one torque opening in the thermal barrier plate and into the at least one susceptor torque opening. At least three kinematic mount assemblies are positioned in different leveling holes in the thermal barrier plate. Each kinematic mount assembly comprises a mounting stud having an inner surface, an outer surface and a length defined by a top surface and a bottom surface. The mounting stud is sized to fit within the leveling hole. The kinematic mount assemblies include a lockdown screw positioned to contact the inner surface of the mounting stud and move along the length of the mounting stud.

Further embodiments of the disclosure are directed to methods of leveling a susceptor. The methods comprise turning a lockdown screw to move the lockdown screw within a mounting stud of a kinematic mount assembly. The movement of the lockdown screw causes a relative change in distance between a thermal barrier plate connected to the kinematic mount assembly and a torque plate, so that a plane formed by a top surface of the thermal barrier plate tilts relative to a plane formed by a top surface of the torque plate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

Figure 1:
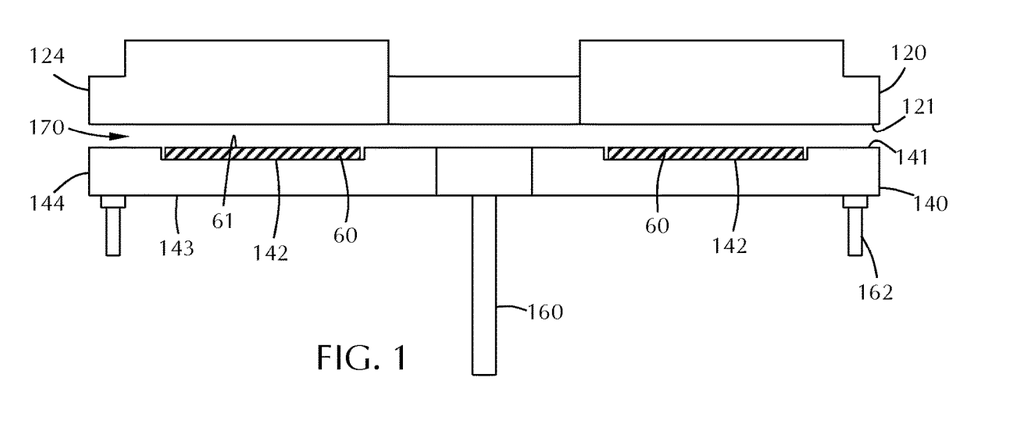
FIG. 1 shows a cross-sectional view of a batch processing chamber in accordance with one or more embodiment of the disclosure.

FIG. 1 shows a cross-section of a processing chamber 100 including a gas distribution assembly 120, also referred to as injectors or an injector assembly, and a susceptor assembly 140. The gas distribution assembly 120 is any type of gas delivery device used in a processing chamber. The gas distribution assembly 120 includes a front surface 121 which faces the susceptor assembly 140. The front surface 121 can have any number or variety of openings to deliver a flow of gases toward the susceptor assembly 140. The gas distribution assembly 120 also includes an outer edge 124 which in the embodiments shown, is substantially round.

The specific type of gas distribution assembly 120 used can vary depending on the particular process being used. Embodiments of the disclosure can be used with any type of processing system where the gap between the susceptor and the gas distribution assembly is controlled. While various types of gas distribution assemblies can be employed (e.g., showerheads), embodiments of the disclosure may be particularly useful with spatial gas distribution assemblies which have a plurality of substantially parallel gas channels. As used in this specification and the appended claims, the term "substantially parallel" means that the elongate axis of the gas channels extend in the same general direction. There can be slight imperfections in the parallelism of the gas channels. In a binary reaction, the plurality of substantially parallel gas channels can include at least one first reactive gas A channel, at least one second reactive gas B channel, at least one purge gas P channel and/or at least one vacuum V channel. The gases flowing from the first reactive gas A channel(s), the second reactive gas B channel(s) and the purge gas P channel(s) are directed toward the top surface of the wafer. Some of the gas flow moves horizontally across the surface of the wafer and out of the process region through the purge gas P channel(s). A substrate moving from one end of the gas distribution assembly to the other end will be exposed to each of the process gases in turn, forming a layer on the substrate surface.

Figure 2:
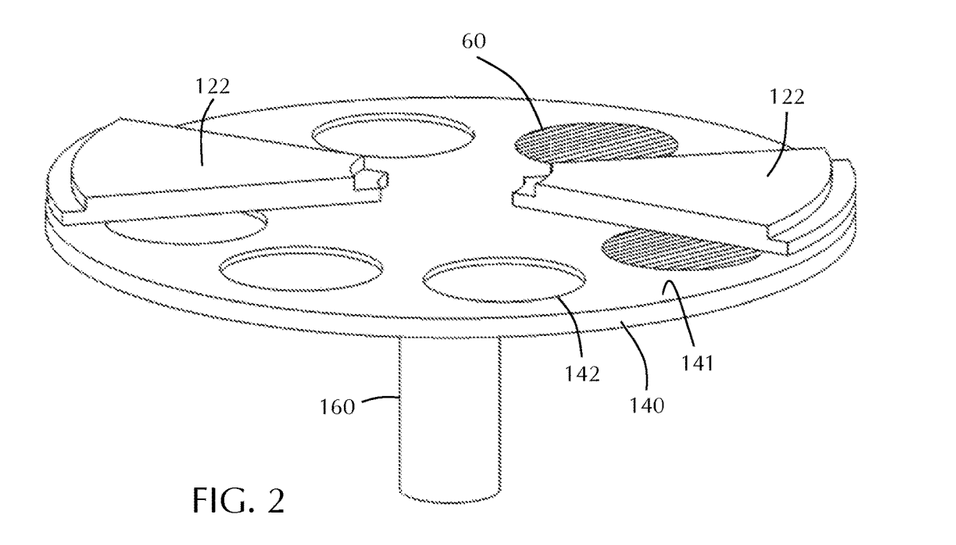
FIG. 2 shows a partial perspective view of a batch processing chamber in accordance with one or more embodiment of the disclosure.

In some embodiments, the gas distribution assembly 120 is a rigid stationary body made of a single injector unit. In one or more embodiments, the gas distribution assembly 120 is made up of a plurality of individual sectors (e.g., injector units 122), as shown in FIG. 2. Either a single piece body or a multi-sector body can be used with the various embodiments of the disclosure described.

A susceptor assembly 140 is positioned beneath the gas distribution assembly 120. The susceptor assembly 140 includes a top surface 141 and at least one recess 142 in the top surface 141. The susceptor assembly 140 also has a bottom surface 143 and an edge 144. The recess 142 can be any suitable shape and size depending on the shape and size of the substrates 60 being processed. In the embodiment shown in FIG. 1, the recess 142 has a flat bottom to support the bottom of the wafer; however, the bottom of the recess can vary. In some embodiments, the recess has step regions around the outer peripheral edge of the recess which are sized to support the outer peripheral edge of the wafer. The amount of the outer peripheral edge of the wafer that is supported by the steps can vary depending on, for example, the thickness of the wafer and the presence of features already present on the back side of the wafer.

In some embodiments, as shown in FIG. 1, the recess 142 in the top surface 141 of the susceptor assembly 140 is sized so that a substrate 60 supported in the recess 142 has a top surface 61 substantially coplanar with the top surface 141 of the susceptor 140. As used in this specification and the appended claims, the term "substantially coplanar" means that the top surface of the wafer and the top surface of the susceptor assembly are coplanar within ±0.2 mm. In some embodiments, the top surfaces are coplanar within 0.5 mm, ±0.4 mm, ±0.35 mm, ±0.30 mm, ±0.25 mm, ±0.20 mm, ±0.15 mm, ±0.10 mm or ±0.05 mm.

The susceptor assembly 140 of FIG. 1 includes a support post 160 which is capable of lifting, lowering and rotating the susceptor assembly 140. The susceptor assembly may include a heater, or gas lines, or electrical components within the center of the support post 160. The support post 160 may be the primary means of increasing or decreasing the gap between the susceptor assembly 140 and the gas distribution assembly 120, moving the susceptor assembly 140 into proper position. The susceptor assembly 140 may also include fine tuning actuators 162 which can make micro-adjustments to susceptor assembly 140 to create a predetermined gap 170 between the susceptor assembly 140 and the gas distribution assembly 120.

In some embodiments, the gap 170 distance is in the range of about 0.1 mm to about 5.0 mm, or in the range of about 0.1 mm to about 3.0 mm, or in the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

The processing chamber 100 shown in the Figures is a carousel-type chamber in which the susceptor assembly 140 can hold a plurality of substrates 60. As shown in FIG. 2, the gas distribution assembly 120 may include a plurality of separate injector units 122, each injector unit 122 being capable of depositing a film on the wafer, as the wafer is moved beneath the injector unit. Two pie-shaped injector units 122 are shown positioned on approximately opposite sides of and above the susceptor assembly 140. This number of injector units 122 is shown for illustrative purposes only. It will be understood that more or less injector units 122 can be included. In some embodiments, there are a sufficient number of pie-shaped injector units 122 to form a shape conforming to the shape of the susceptor assembly 140. In some embodiments, each of the individual pie-shaped injector units 122 may be independently moved, removed and/or replaced without affecting any of the other injector units 122. For example, one segment may be raised to permit a robot to access the region between the susceptor assembly 140 and gas distribution assembly 120 to load/unload substrates 60.

Figure 3:
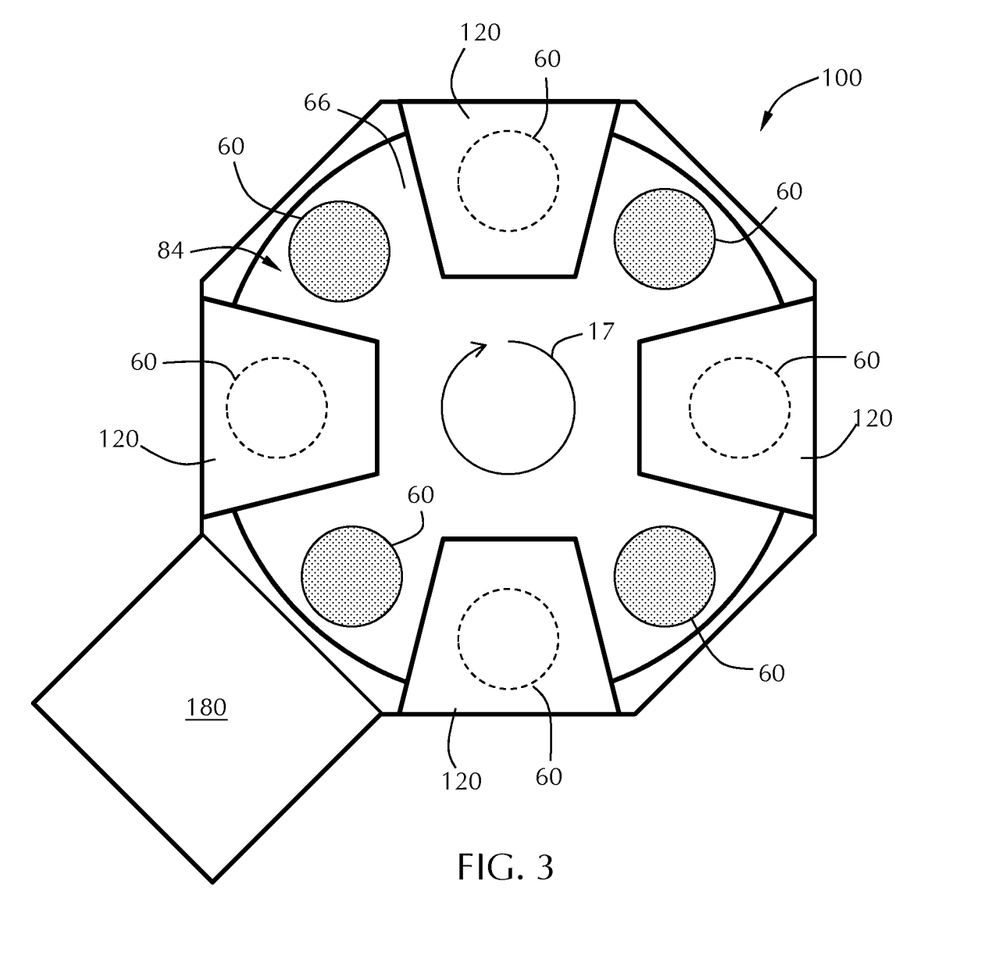
FIG. 3 shows a schematic view of a batch processing chamber in accordance with one or more embodiment of the disclosure.

Processing chambers having multiple gas injectors can be used to process multiple wafers simultaneously so that the wafers experience the same process flow. For example, as shown in FIG. 3, the processing chamber 100 has four gas injector assemblies and four substrates 60. At the outset of processing, the substrates 60 can be positioned between the injector assemblies 30. Rotating 17 the susceptor assembly 140 by 45° will result in each substrate 60 which is between gas distribution assemblies 120 to be moved to an gas distribution assembly 120 for film deposition, as illustrated by the dotted circle under the gas distribution assemblies 120. An additional 45° rotation would move the substrates 60 away from the injector assemblies 30. The number of substrates 60 and gas distribution assemblies 120 can be the same or different. In some embodiments, there are the same numbers of wafers being processed as there are gas distribution assemblies. In one or more embodiments, the number of wafers being processed are fraction of or an integer multiple of the number of gas distribution assemblies. For example, if there are four gas distribution assemblies, there are 4x wafers being processed, where x is an integer value greater than or equal to one. In an exemplary embodiment, the gas distribution assembly 120 includes eight process regions separated by gas curtains and the susceptor assembly 140 can hold six wafers.

The processing chamber 100 shown in FIG. 3 is merely representative of one possible configuration and should not be taken as limiting the scope of the disclosure. Here, the processing chamber 100 includes a plurality of gas distribution assemblies 120. In the embodiment shown, there are four gas distribution assemblies (also called injector assemblies 30) evenly spaced about the processing chamber 100. The processing chamber 100 shown is octagonal; however, those skilled in the art will understand that this is one possible shape and should not be taken as limiting the scope of the disclosure. The gas distribution assemblies 120 shown are trapezoidal, but can be a single circular component or made up of a plurality of pie-shaped segments, like that shown in FIG. 2.

The embodiment shown in FIG. 3 includes a load lock chamber 180, or an auxiliary chamber like a buffer station. This chamber 180 is connected to a side of the processing chamber 100 to allow, for example the substrates (also referred to as substrates 60) to be loaded/unloaded from the chamber 100. A wafer robot may be positioned in the chamber 180 to move the substrate onto the susceptor.

Rotation of the carousel (e.g., the susceptor assembly 140) can be continuous or intermittent (discontinuous). In continuous processing, the wafers are constantly rotating so that they are exposed to each of the injectors in turn. In discontinuous processing, the wafers can be moved to the injector region and stopped, and then to the region 84 between the injectors and stopped. For example, the carousel can rotate so that the wafers move from an inter-injector region across the injector (or stop adjacent the injector) and on to the next inter-injector region where the carousel can pause again. Pausing between the injectors may provide time for additional processing steps between each layer deposition (e.g., exposure to plasma).

Figure 4:
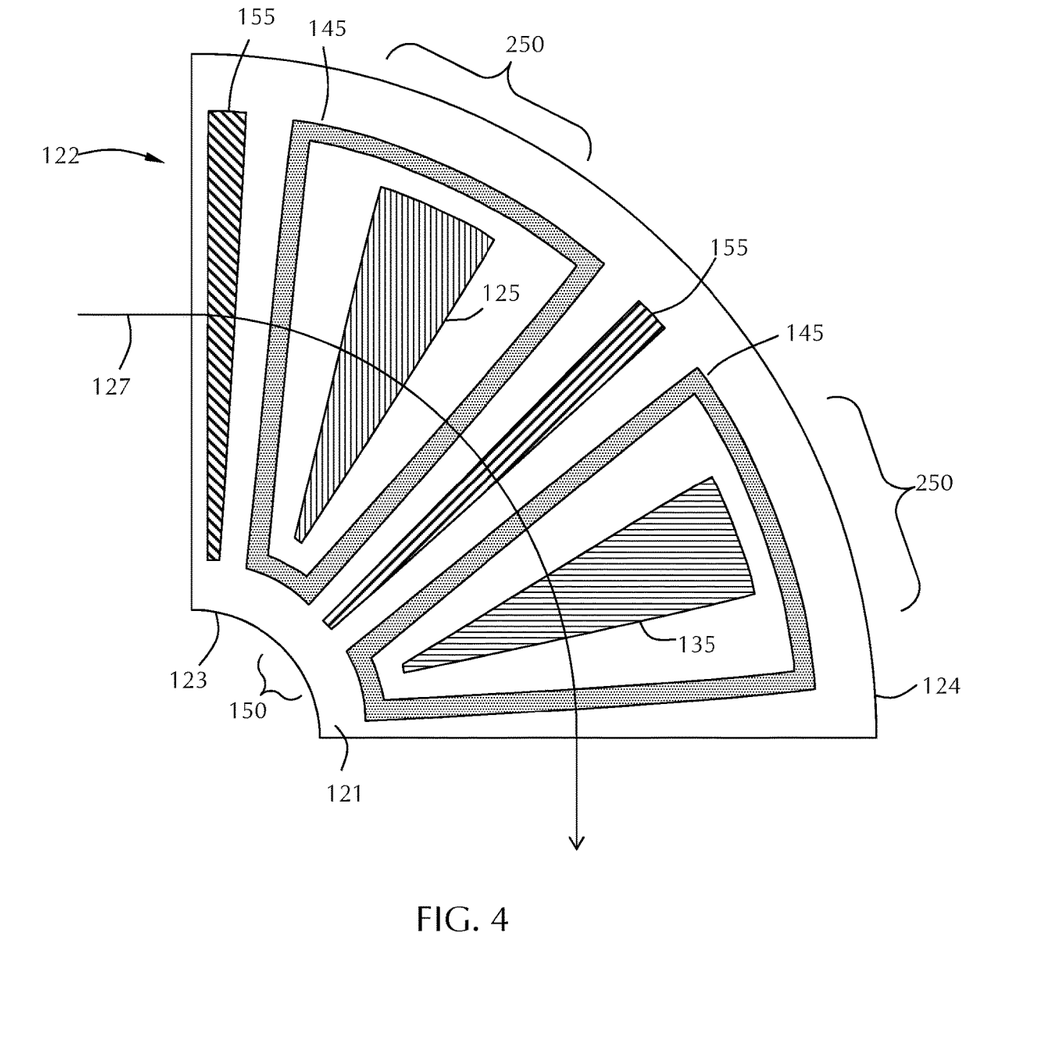
FIG. 4 shows a schematic view of a portion of a wedge shaped gas distribution assembly for use in a batch processing chamber in accordance with one or more embodiment of the disclosure.
Figure 5:
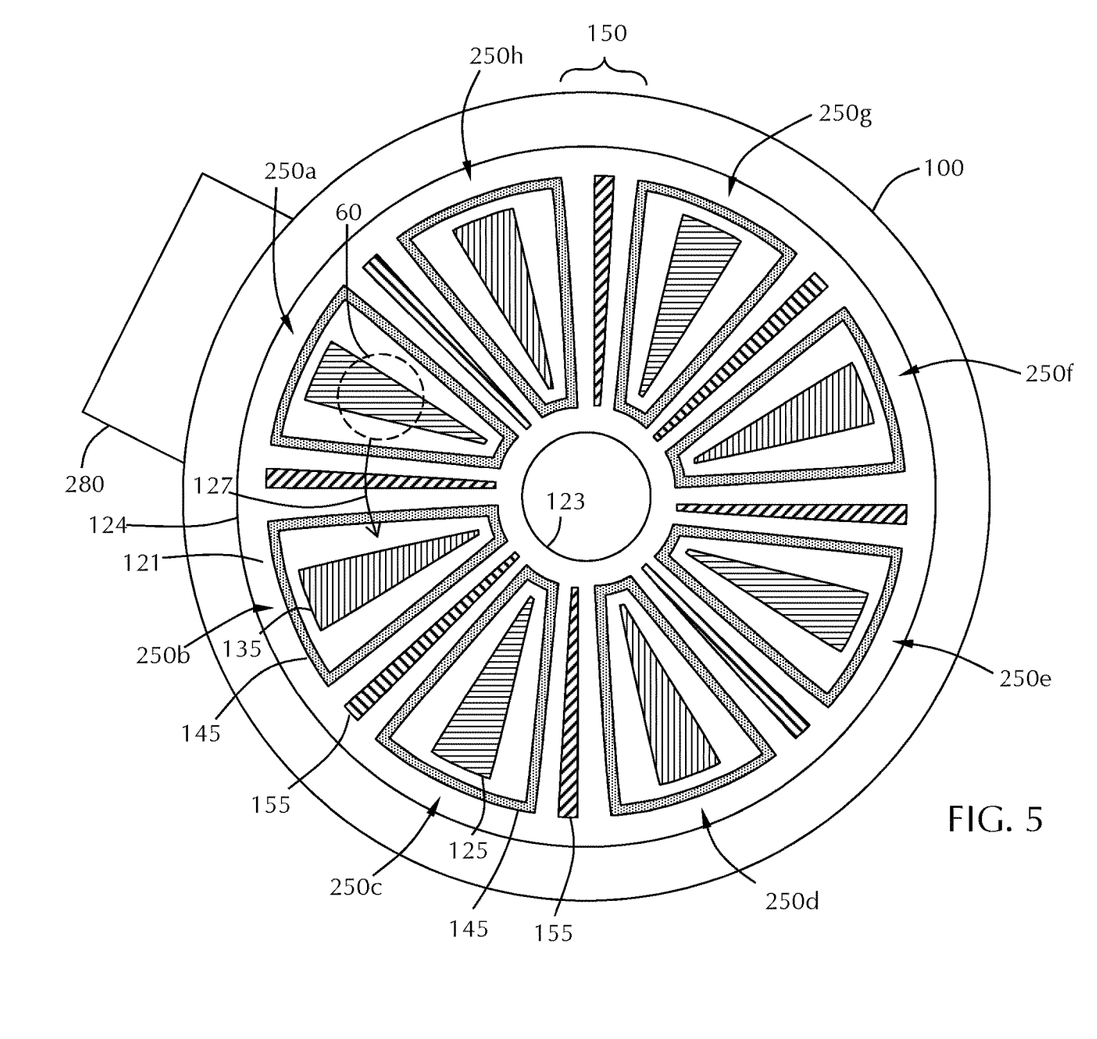
FIG. 5 shows a schematic view of a batch processing chamber in accordance with one or more embodiment of the disclosure.

FIG. 4 shows a sector or portion of a gas distribution assembly 220, which may be referred to as an injector unit 122. The injector units 122 can be used individually or in combination with other injector units. For example, as shown in FIG. 5, four of the injector units 122 of FIG. 4 are combined to form a single gas distribution assembly 220. (The lines separating the four injector units are not shown for clarity.) While the injector unit 122 of FIG. 4 has both a first reactive gas port 125 and a second gas port 135 in addition to purge gas ports 155 and vacuum ports 145, an injector unit 122 does not need all of these components.

Referring to both FIGS. 4 and 5, a gas distribution assembly 220 in accordance with one or more embodiment may comprise a plurality of sectors (or injector units 122) with each sector being identical or different. The gas distribution assembly 220 is positioned within the processing chamber and comprises a plurality of elongate gas ports 125, 135, 145 in a front surface 121 of the gas distribution assembly 220. The plurality of elongate gas ports 125, 135, 145, 155 extend from an area adjacent the inner peripheral edge 123 toward an area adjacent the outer peripheral edge 124 of the gas distribution assembly 220. The plurality of gas ports shown include a first reactive gas port 125, a second gas port 135, a vacuum port 145 which surrounds each of the first reactive gas ports and the second reactive gas ports and a purge gas port 155.

With reference to the embodiments shown in FIG. 4 or 5, when stating that the ports extend from at least about an inner peripheral region to at least about an outer peripheral region, however, the ports can extend more than just radially from inner to outer regions. The ports can extend tangentially as vacuum port 145 surrounds reactive gas port 125 and reactive gas port 135. In the embodiment shown in FIGS. 4 and 5, the wedge shaped reactive gas ports 125, 135 are surrounded on all edges, including adjacent the inner peripheral region and outer peripheral region, by a vacuum port 145.

Referring to FIG. 4, as a substrate moves along path 127, each portion of the substrate surface is exposed to the various reactive gases. To follow the path 127, the substrate will be exposed to, or "see", a purge gas port 155, a vacuum port 145, a first reactive gas port 125, a vacuum port 145, a purge gas port 155, a vacuum port 145, a second gas port 135 and a vacuum port 145. Thus, at the end of the path 127 shown in FIG. 4, the substrate has been exposed to the first reactive gas 125 and the second reactive gas 135 to form a layer. The injector unit 122 shown makes a quarter circle but could be larger or smaller. The gas distribution assembly 220 shown in FIG. 5 can be considered a combination of four of the injector units 122 of FIG. 4 connected in series.

The injector unit 122 of FIG. 4 shows a gas curtain 150 that separates the reactive gases. The term "gas curtain" is used to describe any combination of gas flows or vacuum that separate reactive gases from mixing. The gas curtain 150 shown in FIG. 4 comprises the portion of the vacuum port 145 next to the first reactive gas port 125, the purge gas port 155 in the middle and a portion of the vacuum port 145 next to the second gas port 135. This combination of gas flow and vacuum can be used to prevent or minimize gas phase reactions of the first reactive gas and the second reactive gas.

Referring to FIG. 5, the combination of gas flows and vacuum from the gas distribution assembly 220 form a separation into a plurality of process regions 250. The process regions are roughly defined around the individual gas ports 125, 135 with the gas curtain 150 between 250. The embodiment shown in FIG. 5 makes up eight separate process regions 250 with eight separate gas curtains 150 between. A processing chamber can have at least two process regions. In some embodiments, there are at least three, four, five, six, seven, eight, nine, 10, 11 or 12 process regions.

During processing a substrate may be exposed to more than one process region 250 at any given time. However, the portions that are exposed to the different process regions will have a gas curtain separating the two. For example, if the leading edge of a substrate enters a process region including the second gas port 135, a middle portion of the substrate will be under a gas curtain 150 and the trailing edge of the substrate will be in a process region including the first reactive gas port 125.

A factory interface 280, which can be, for example, a load lock chamber, is shown connected to the processing chamber 100. A substrate 60 is shown superimposed over the gas distribution assembly 220 to provide a frame of reference. The substrate 60 may often sit on a susceptor assembly to be held near the front surface 121 of the gas distribution plate 120. The substrate 60 is loaded via the factory interface 280 into the processing chamber 100 onto a substrate support or susceptor assembly (see FIG. 3). The substrate 60 can be shown positioned within a process region because the substrate is located adjacent the first reactive gas port 125 and between two gas curtains 150a, 150b. Rotating the substrate 60 along path 127 will move the substrate counter-clockwise around the processing chamber 100. Thus, the substrate 60 will be exposed to the first process region 250a through the eighth process region 250h, including all process regions between.

Embodiments of the disclosure are directed to processing methods comprising a processing chamber 100 with a plurality of process regions 250a-250h with each process region separated from an adjacent region by a gas curtain 150. For example, the processing chamber shown in FIG. 5. The number of gas curtains and process regions within the processing chamber can be any suitable number depending on the arrangement of gas flows. The embodiment shown in FIG. 5 has eight gas curtains 150 and eight process regions 250a-250h.

A plurality of substrates 60 are positioned on a substrate support, for example, the susceptor assembly 140 shown FIGS. 1 and 2. The plurality of substrates 60 are rotated around the process regions for processing. Generally, the gas curtains 150 are engaged (gas flowing and vacuum on) throughout processing including periods when no reactive gas is flowing into the chamber.

In some embodiments, the ALD susceptors are mounted directly on the pedestal and there is no adjustment to level the susceptor to injector. Parallelism of less than about 0.1 mm is minimized by external means like shims or manual adjustments. The susceptor mounts on a stack of two stainless steel plates bolted to a motor shaft. The top plate is generally a thermal barrier plate (~25 mm thick) and the bottom plate is generally a torque plate (~15 mm thick) which has press-fit dowel pins. The dowel pins are used to center and torque the susceptor.

In some embodiments, kinematic mounts in the thermal barrier plate at, for example, bolt circle diameter of 100 mm are used to adjust the parallelism. The kinematic mount studs, which may have ball ends, can be made of a stainless steel stud with a hex socket and a counter bore. The studs can have fine threads (~40 tpi) to allow fine resolution during adjustment.

In some embodiments, to prevent galling of studs in stainless steel plates, a coating, for example Nitronic® 60, can be applied to the studs. As centering is performed with a center pin in a tightly controlled hole in the susceptor, a standard kinematic mount base having a flat vee-cone shape will over-constrain the leveling mechanism. Therefore, the embodiments of the disclosure advantageously provide mount bases that make use of a flat surface of the hardened torque plate.

In some embodiments, coated helicoil inserts are used in the torque plate to prevent galling. Some embodiments of the disclosure advantageously provide a kinematic mount mechanism with increased stability. Some embodiments advantageously provide kinematic mounts with distortion free mounting. One or more embodiments advantageously provide removable and/or repeatable re-positioning.

For example, a one meter diameter susceptor is extremely heavy (~50 kg) and can give enough preload for the kinematic mounts with minimum backlash during leveling. The susceptor mounted on a 100 mm kinematic bolt circle, with an adjustment of just a couple of mils (0.001") can magnify greater than or equal to about 10× at the outer diameter of the susceptor or about 5× at the wafer center. The adjustments are enough to compensate for axial runout of the susceptor.

A susceptor application with wafer chucking capability has been tested with shims that are a couple of mils thick without allowing a large vacuum leak between the plates or wafer chucking. Once the kinematic fine adjustment was done with an allen-wrench (with long handle) to best level, three integrated lock down M6 screws were used to lock the susceptor leveling down to prevent any movement during processing and indexing movements of the susceptor. Each of three M6 screws provided about 2000 lbs of clamping force. A laser based Keyence displacement sensor mounted on the chamber was used to provide feedback to check the leveling. The kinematic mounts of various embodiments of the disclosure can be used for fine leveling to make the susceptor top surface parallel to the injector plane (e.g., to within ~0.1 mm). In some embodiments, there are three kinematic mounts. In some embodiments, the threads of the kinematic mounts are 40 pitch threads which can be used to fine level the susceptor. In one or more embodiments, the susceptor allows access to the kinematic mounts to make adjustments of the thermal barrier and torque plates to level the susceptor.

Figure 6:
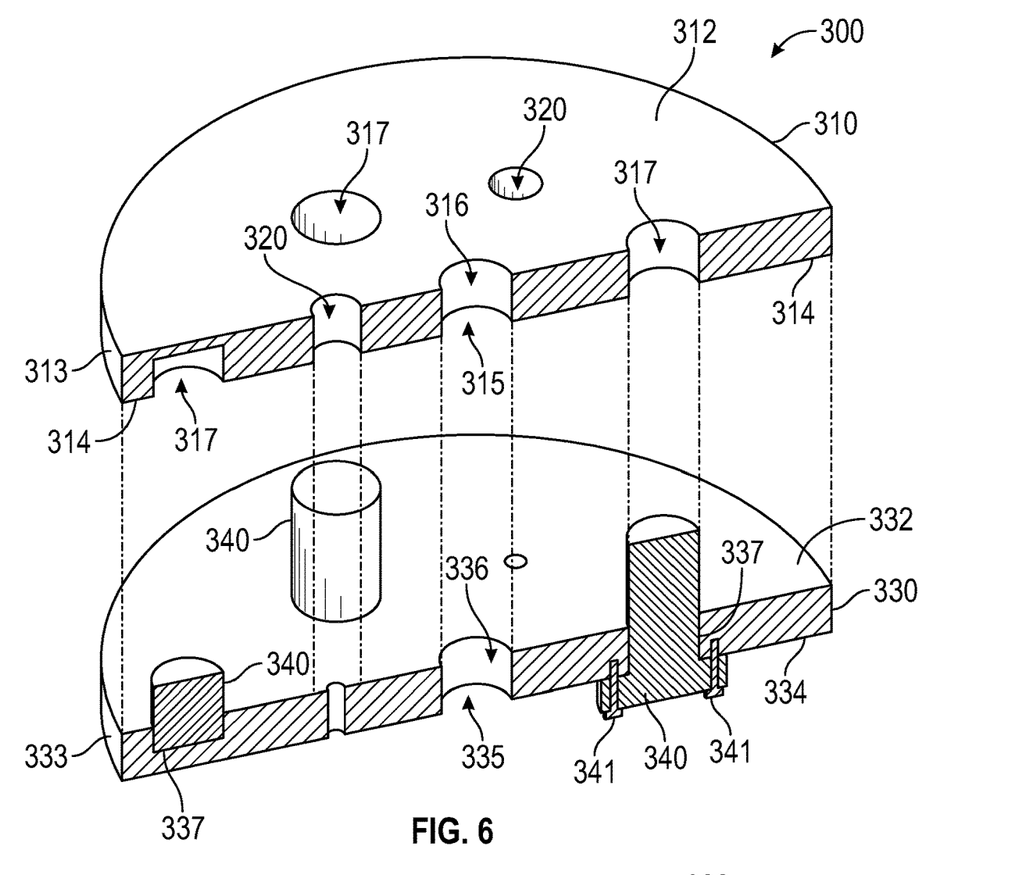
FIG. 6 shows an exploded view of a pedestal assembly in accordance with one or more embodiment of the disclosure.
Figure 7:
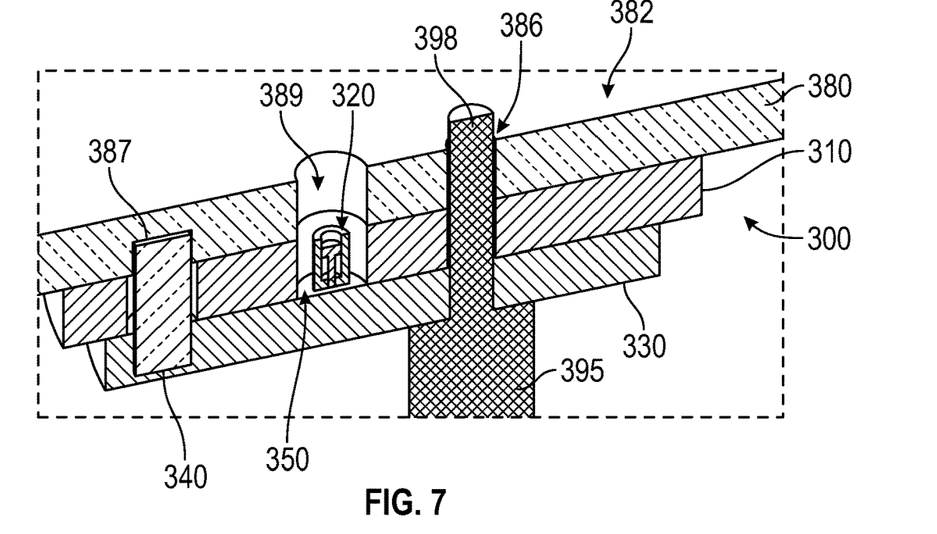
FIG. 7 shows a susceptor assembly in accordance with one or more embodiment of the disclosure.
Figure 8:
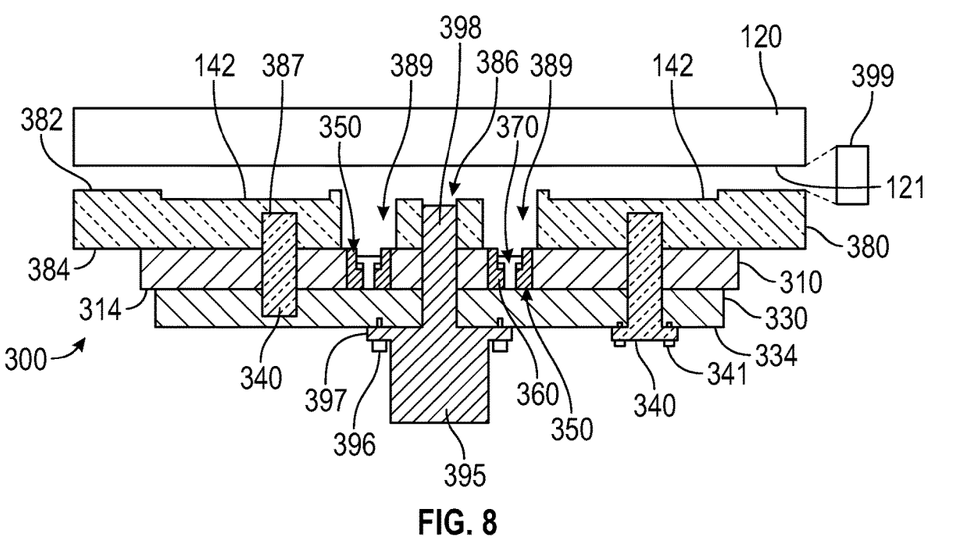
FIG. 8 shows a susceptor assembly in accordance with one or more embodiment of the disclosure.

Referring to FIGS. 6-8, one or more embodiments of the disclosure are directed to pedestal assemblies 300 comprising a thermal barrier plate 310 and a torque plate 330. FIG. 6 shows an exploded view of a pedestal assembly 300 with the thermal barrier plate 310 and torque plate 330 separated.

The thermal barrier plate 310 has a top surface 312 and a bottom surface 314 that define a thickness of the thermal barrier plate 310. The thermal barrier plate 310 can have a sidewall 313 or can have the top and bottom surfaces connect directly. The thermal barrier plate 310 shown is a generally disk-shaped component with a plurality of openings and/or recesses therein. The various openings and recesses can be used to pass components through the thickness of the thermal barrier plate 310 and/or to align the thermal barrier plate 310 with other components. A center opening 316 extends through the thickness of the thermal barrier plate 310 at a center of the thermal barrier plate 310. The center opening 316 can be used to align the center of the thermal barrier plate 310 with the center of other components; for example, the torque plate 330. In some embodiments, there is no center opening 316 in the thermal barrier plate 310.

The thermal barrier plate 310 includes at least one torque opening 317 extending through at least the bottom surface 314 of the thermal barrier plate 310. The embodiment of FIG. 6 has three torque openings 317 shown. The left-most torque opening 317 extends from the bottom surface 314 part-way through the thickness of the thermal barrier plate 310 and does not form an opening in the top surface 312. The other torque openings 317 shown pass completely through the thickness of the thermal barrier plate 310 from the bottom surface 314 to the top surface 312 and forms an opening in both surfaces.

The thermal barrier plate 310 also includes at least one leveling hole 320 in the thickness of the thermal barrier plate 310. Each of the leveling holes 320 are located a distance from the center 315 and the center opening 316. The distance from the center 315 can be varied for each of the leveling holes 320, or each can be located at about the same distance from the center 320. The distance between the center 315 and the leveling hole 320 of some embodiments is in the range of about 5% to about 75% of the distance between the center 315 and the sidewall 313 of the thermal barrier plate 310. In some embodiments, the distance between the center 315 and the leveling hole 320 is in the range of about 10% to about 60%, or in the range of about 15% to about 50%, or in the range of about 20% to about 40% of the distance between the center 315 and the sidewall 313.

The thermal barrier plate 310 can be made from any suitable material. In some embodiments, the thermal barrier plate 310 is made from stainless steel.

The torque plate 330 is below the thermal barrier plate 310. The torque plate 330 has a top surface 332, a bottom surface 334 defining a thickness and a sidewall 333. A center opening 336 is located in the center 335 of the torque plate 330 and extends through the thickness of the torque plate 330. The center opening 336 can be used to align the center of the thermal barrier plate 330 with the center of other components; for example, the thermal barrier plate 310. In some embodiments, there is no center opening 336 in the torque plate 330.

At least one torque rod 340 extends from the top surface 332 of the torque plate 330 and is aligned with the at least one torque opening 317 in the thermal barrier plate 310. The torque rod 340 allows rotation of the torque plate 330 to cause rotation of the thermal barrier plate 310. The torque rod 340 shown on the left in FIG. 6 extends from a torque opening 337 in the torque plate 330. The torque opening 337 extends from the top surface 332 of the torque plate 330 a distance into the thickness of the torque plate 330 without passing through the torque plate. The torque rod 340 on the right side of the center 335 of the torque plate 330 passes through a torque opening 337 that extends through the thickness of the torque plate 340. The torque rod 340 is connected to the bottom surface 334 of the torque plate 330 using a fastener 341 (e.g., bolts). The fastener 341 of some embodiments is a bolt and also includes a washer to add lock protection to prevent the bolt from backing out. In some embodiments, the washer is a lock washer. In some embodiments, the washer is a Belleville washer. The Belleville washer (also known as a coned-disc spring, conical spring washer, or cupped spring washer) can be a single disk, parallel, series or series-parallel configurations. The Belleville washer can allow vertical spacing in the holes for the fasteners.

The torque plate 330 can be made from any suitable material. In some embodiments, the torque plate 330 is made from a material comprising stainless steel.

Some embodiments of the disclosure are directed to susceptor assemblies, as shown in FIGS. 7 and 8. The susceptor assembly of some embodiments comprises a susceptor 380, a thermal barrier plate 310 and a torque plate 330. The susceptor 380 can have a top surface 382 and a bottom surface 384 defining a susceptor thickness. A plurality of recesses 142 are formed in the top surface 382 of the susceptor 380 and are sized to support a substrate during processing.

Some embodiments of the susceptor 380 include a center opening 386 that extends from the bottom surface 384. In the embodiment shown in FIGS. 7 and 8, the center opening 386 extends through the thickness of the susceptor 380 from the bottom surface 384 to the top surface 382. The center opening 386 of the susceptor can be used to align the center of the susceptor 380 with other components (e.g., thermal barrier plate 310).

The susceptor 380 can be made from any suitable material. In some embodiments, the susceptor 380 comprises graphite.

The susceptor 380 can include at least one susceptor torque opening 387 that extends from the bottom surface 384 of the susceptor. In the embodiment of FIGS. 7 and 8, the susceptor torque opening 387 extends partially through the thickness of the susceptor 380. In some embodiments, the susceptor torque opening 387 extends through the thickness of the susceptor 380 from the bottom surface 384 to the top surface 382. The susceptor torque openings 387 may be sized and aligned to allow a torque rod 340 to be positioned within the opening 387. The torque rod 340 can be used to cause the susceptor 380 to be rotated with the torque rod 340 is moved.

In some embodiments, the susceptor 380 includes at least one leveling hole 389. The leveling holes 389 extend through the thickness of the susceptor 380 to allow access to a kinetic mount assembly 350 below the susceptor 380. The number of leveling holes 389 in the susceptor 380 can be more than, equal to, or less than the number of kinetic mount assemblies 350.

As shown in FIGS. 7-11, the pedestal assembly 300 includes at least one kinematic mount assembly 350. The kinematic mount assembly 350 is positioned within at least one of the leveling holes 320 in the thermal barrier plate 310. The kinematic mount assembly 350 comprises a mounting stud 360 and a lockdown screw 370.

Figure 9:
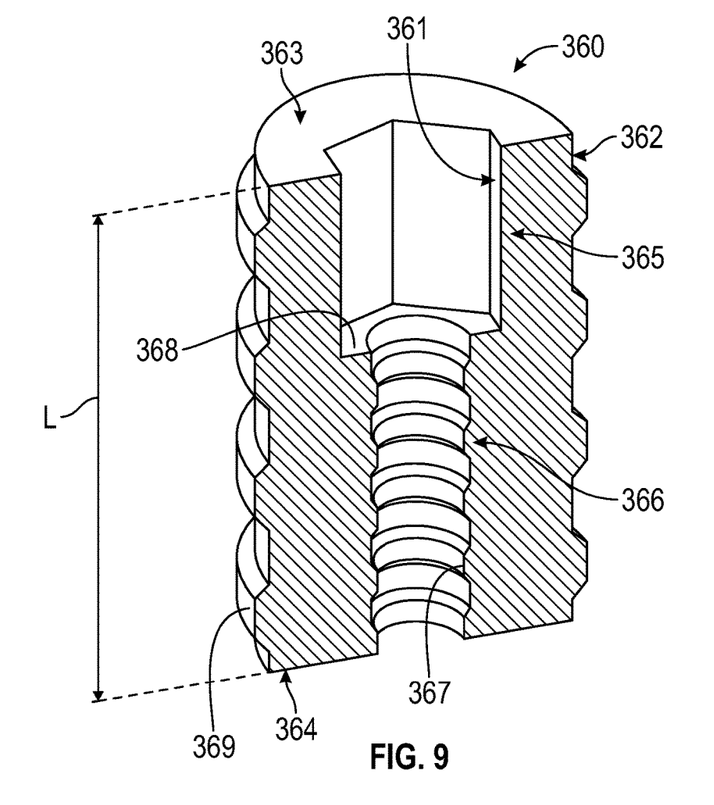
FIG. 9 shows a mounting stud of a kinematic mount assembly in accordance with one or more embodiment of the disclosure.

Referring to FIG. 9, the mounting stud 360 has an inner surface 361, an outer surface 362 and a length L defined by a top surface 363 and a bottom surface 364. The mounting stud 360 is sized to fit within the leveling hole 320.

In the embodiment shown in FIG. 9, the inner surface 361 of the mounting stud 360 has an upper portion 365 and a lower portion 366. The upper portion 365 and lower portion 366 of the embodiment shown have different diameters with the upper portion 365 having a larger diameter than the lower portion 366.

The lower portion 366 of the mounting stud 360 may include screw threads 367 on the inner surface 361. The pitch of the screw threads 367 can be changed to allow for fine movement of a screw passing through the mounting stud 360. In some embodiments, the pitch of the screw threads 367 is in the range of about 25 to about 50.

Figure 11:
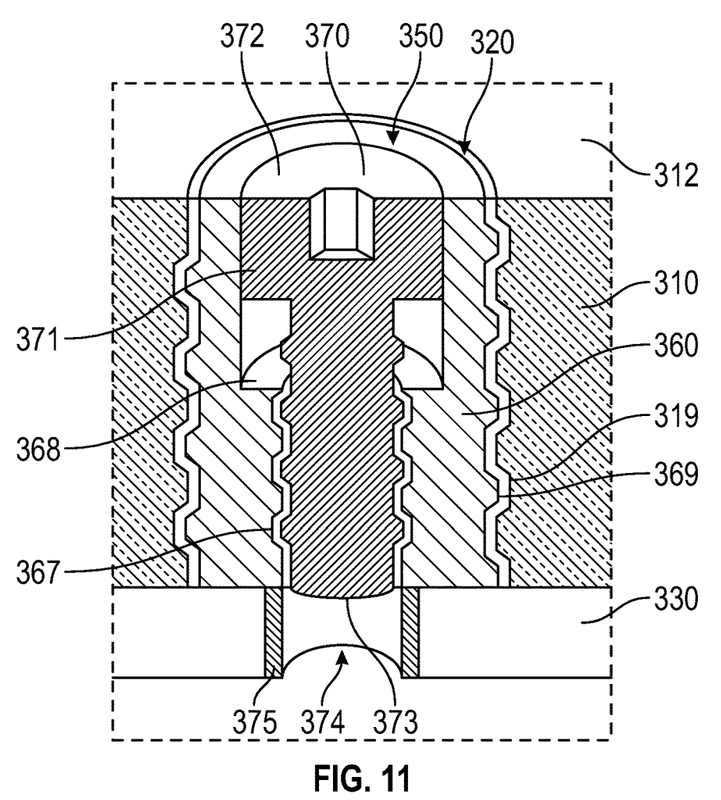
FIG. 11 shows a pedestal assembly with kinematic mount assembly in accordance with one or more embodiment of the disclosure.

In some embodiments, as shown in FIG. 9, there is a horizontal ledge 368 separating the upper portion 365 and the lower portion 366. The horizontal ledge 368 can provide a physical barrier to prevent a head 371 of a lockdown screw 370 from passing. As shown in FIG. 11, the head 371 of the lockdown screw 370 may have a diameter that is larger than the diameter of the lower portion 366 of the mounting stud 360 and the horizontal ledge 368 prevents the head 371 from moving past the horizontal ledge 368.

In some embodiments, as shown in FIG. 11, the outer surface 362 of the mounting stud 360 includes outer screw threads 369. The leveling hole 320 in the thermal barrier plate 310 comprises screw threads 319 that are complementary to the outer screw threads 369 of the mounting stud 360. The mounting stud 360 can be moved into and out of the leveling hole 320 by turning the mounting stud 360. The mounting stud 360 can be turned by any suitable tool including, but not limited to, a hex key. For example, the mounting stud 360 shown in FIGS. 9 and 11 have a hex opening in the top of the mounting stud 360 which serves as both the upper portion 365 and provides a physical component to interact with the tool.

The mounting stud 360 can be positioned so that the top 372 is level with, above or below the top surface 312 of the thermal barrier plate 310. For example, the embodiment shown in FIG. 11 has the top 372 of the mounting stud 360 about level with the top surface 312 of the thermal barrier plate 310. In the embodiment shown in FIG. 10, the top 372 of the mounting stud 360 is below the top surface 312 of the thermal barrier plate 310. In the embodiment shown, the leveling hole 320 in the thermal barrier plate 310 is shaped to prevent the mounting stud 360 from moving upward to the top surface 312 of the thermal barrier plate 310.

Figure 10:
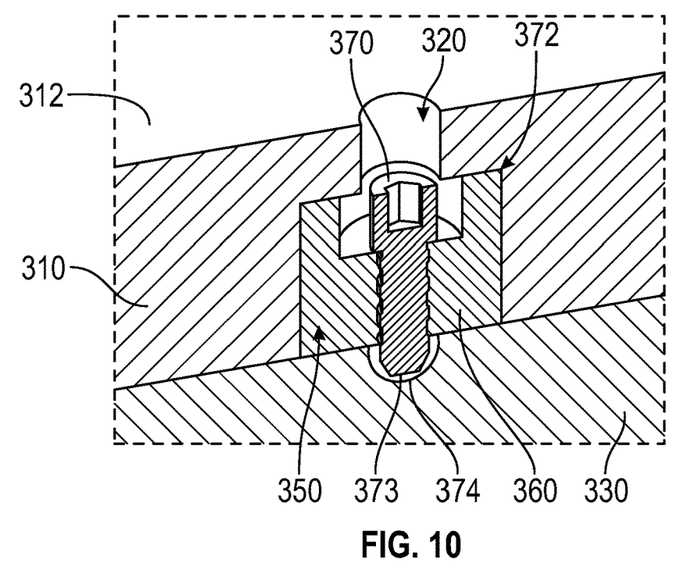
FIG. 10 shows a pedestal assembly with kinematic mount assembly in accordance with one or more embodiment of the disclosure.

With reference to FIGS. 10 and 11, some embodiments of the kinetic mount assembly 350 include a lockdown screw 370. The lockdown screw 370 can be positioned to contact the inner surface 361 of the mounting stud 360. The lockdown screw 370 is configured to move along the length of the mounting stud 360 when the lockdown screw is turned. The lockdown screw 370 can be turned by any suitable tool including, but not limited to, a hex key.

The lockdown screw 370 has a lower surface 373 that interacts with the torque plate 330 to change the plane of the top surface of the thermal barrier plate 310. In the embodiment shown in FIG. 10, the lockdown screw 370 has a lower surface 373 with a convex shape and the torque plate 330 further comprises a recess 374 aligned with and sized to cooperatively interact with the lower surface 373 of the lockdown screw 370. The recess 374 can be, for example, a concave recess, and elongate concave recess, an elongate v-shaped groove, to allow the lower surface 373 of the lockdown screw 370 to move in multiple directions when contacting the recess 374.

In some embodiments, as shown in FIG. 11, the recess 374 is a hole that passes through the torque plate 330 and has an insert 375 to interact with the lower surface 373 of the lockdown screw 370. The insert can be made from any suitable material including, but not limited to, Nitronic® 60 (a mixture of Cr, Mn, Ni, Si, N, C and Fe).

In some embodiments, the pedestal assembly 300 includes at least three kinematic mount assemblies 350 and/or at least three mounting studs 360. Three kinematic mount assemblies 350 can provide three dimensional control of the plane formed by the top surface of the thermal barrier plate 310 to level the susceptor 380.

In some embodiments, there are at least three mounting studs 360 with each mounting stud 360 positioned in a different leveling hole 320 in the thermal barrier plate 310. The at least three leveling holes 320 in the thermal barrier plate 310 can be positioned equidistant from the center 315 of the thermal barrier plate 310 or can be at different distances from the center 315.

In some embodiments, there are at least three torque pins 340 that pass through the thermal barrier plate 310 to extend a distance above the top surface of the thermal barrier plate 310. In some embodiments, the torque pins 340 are sized to be within the body of the susceptor 380 so that a top of the torque pin 340 is not visible at the top surface 382 of the susceptor 380.

Referring again to FIGS. 7 and 8, some embodiments further comprise a support post 395 connected to the torque plate 330. In the embodiment of FIG. 8, the support post 395 is connected to the torque plate 330 with fasteners 396 passing through a flange 397 on the support post 395.

In one or more embodiments, the support post 395 includes a centering pillar 398. The centering pillar 398 can be integrally formed with the support post 395, as shown in FIG. 8, or can be a separate component, as shown in FIG. 7. The centering pillar 398 can pass through the center hole 336 in the torque plate 330 and into the center hole 316 of the thermal barrier plate 310. In some embodiments, the centering pillar 398 passes through the thermal barrier plate 310 and into the center opening 386 of the susceptor 380.

Referring to FIG. 8, one or more embodiments of the disclosure are directed to methods of leveling a susceptor 380 relative to a gas distribution assembly 120. The method can be used to make the plane formed by the top surface 382 of the susceptor 380 be parallel with the plane formed by the front surface 121 of the gas distribution assembly 120.

In some embodiments, the method comprises turning a lockdown screw 370 to move the lockdown screw 370 within a mounting stud 360 of a kinematic mount assembly 350. The movement of the lockdown screw 370 causes a relative change in distance between a thermal barrier plate 310 connected to the kinematic mount assembly 350 and a torque plate 330, so that a plane formed by a top surface 312 of the thermal barrier plate 310 tilts relative to a plane formed by a top surface 332 of the torque plate 330. When a susceptor 380 is positioned on the thermal barrier plate 310, the tilting of the plane formed by the top surface causes the susceptor 380 to tilt and the plane formed by the top surface 382 of the susceptor to tilt. Adjusting multiple kinematic mount assemblies 350 can be used to change the tile of the susceptor 380 in three dimensions.

In some embodiments, the lockdown screw 370 is accessed through a leveling opening 389 in the susceptor 380. The leveling openings 389 can be positioned above or aligned with the thermal barrier plate 310 and the torque plate 330 so that a plane formed by the top surface 382 of the susceptor 380 tilts relative to the plane formed by the top surface of the torque plate 330.

In use, one or more cameras 399 are used to measure the distance between the gas distribution assembly 120 and the susceptor 380. The camera 399 has a field of view that allows for the measurement of the spacing between the surfaces. When measurement of the space between the susceptor 380 and the gas distribution assembly 120 at multiple locations (e.g., three locations) shows a difference that affects the parallelism of the susceptor plane and the gas distribution assembly plane, the kinematic mount assemblies 350 can be used. The user can pass, for example, a hex key through the leveling opening 389 of the susceptor 380 and into the kinematic mount assembly 350 located in the thermal barrier plate 310. The hex key can be used to turn a lockdown screw 370 in a mounting stud 360 to move the screw within the mounting stud. Lower the screw can result in the bottom edge of the screw pressing against the torque plate 330 to increase the distance between the thermal barrier plate 310 and the torque plate 330 at the position of the kinematic mount assembly 350. When the kinematic mount assembly 350 is located near the center of the susceptor, small changes in the position of the lockdown screw 370 can cause large differences in the spacing between components near the edges.

Adjusting the kinematic mount assembly 350 to level the susceptor 380 can form a small gap between the thermal barrier plate 310 and the torque plate 330. The gap is typically less than about 2 mil; small enough not to result in gross chucking vacuum leaks as small leaks may be tolerable in chucking wafers in carousel batch processing chambers. In some embodiments, a vacuum bellow (not shown) can be installed below the thermal barrier plate 310 to prevent chucking vacuum pressure loss.

The user can make adjustments to the kinematic mount assemblies 350 multiple times and take multiple measurements using, for example, the camera until a sufficiently uniform spacing, or parallelism, is obtained. While the measurements are described as being performed with a camera, those skilled in the art will understand that other distance measurement devices and techniques can be used.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of leveling a susceptor, the method comprising turning a lockdown screw to move the lockdown screw within a mounting stud of a kinematic mount assembly, wherein movement of the lockdown screw causes a relative change in distance between a thermal barrier plate connected to the kinematic mount assembly and a torque plate, so that a plane formed by a top surface of the thermal barrier plate tilts relative to a plane formed by a top surface of the torque plate.

2. The method of claim 1, further comprising accessing the lockdown screw through a leveling opening in a susceptor positioned above the thermal barrier plate and the torque plate so that a plane formed by a top surface of the susceptor tilts relative to the plane formed by the top surface of the torque plate.

3. The method of claim 1, wherein the thermal barrier plate comprises:
   a center opening extending through a thickness of the thermal barrier plate at a center of the thermal barrier plate;
   at least one torque opening extending through at least a bottom surface of the thermal barrier plate; and
   at least one leveling hole extending through the thickness of the thermal barrier plate, the at least one leveling hole located a distance from the center opening.

4. The method of claim 3, wherein the torque plate is below the thermal barrier plate, the torque plate having a top surface and a bottom surface defining a thickness, a center opening extending through the thickness of the torque plate, at least one torque rod extending from the top surface of the torque plate, the at least one torque rod aligned with the at least one torque opening in the thermal barrier plate.

5. The method of claim 4, wherein the kinematic mount assembly is positioned within at least one leveling hole in the thermal barrier plate, the mounting stud of the kinematic mount assembly having an inner surface, an outer surface and a length defined by a top surface and a bottom surface, the mounting stud sized to fit within the leveling hole.

6. The method of claim 5, wherein turning the lockdown screw causes the lockdown screw to move along a length of the mounting stud.

7. The method of claim 1, wherein the top surface of the mounting stud is below the top surface of the thermal barrier.

8. The method of claim 1, wherein the mounting stud has an inner surface with an upper portion and a lower portion, the upper portion having a larger diameter than the lower portion.

9. The method of claim 8, wherein the lower portion of the inner surface of the mounting stud comprises screw threads.

10. The method of claim 9, wherein the screw threads of the lower portion have a pitch in the range of about 25 to about 50.

11. The method of claim 9, wherein there is a horizontal ledge separating the upper portion and the lower portion, the horizontal ledge providing a physical barrier to prevent a head of the lockdown screw with a diameter larger than the diameter of the lower portion from moving past the horizontal ledge.

12. The method of claim 9, wherein an outer surface of the mounting stud comprises outer screw threads and a leveling hole in the thermal barrier plate comprises screw threads complementary to the outer screw threads of the mounting stud.

13. The method of claim 1, wherein the lockdown screw has a lower surface with a convex shape and the torque plate further comprises a recess aligned with and sized to cooperatively interact with the lower surface of the lockdown screw.

14. The method of claim 1, wherein there are at least three mounting studs, each mounting stud in a different leveling hole in the thermal barrier plate.

15. The method of claim 1, further comprising moving a support post connected to the torque plate.

16. The method of claim 15, wherein the support post includes a centering pillar that passes through the center hole of the torque plate and the center hole of the thermal barrier plate.

* * * * *